(12) United States Patent
Cernea et al.

(10) Patent No.: US 7,046,548 B2
(45) Date of Patent: May 16, 2006

(54) TECHNIQUES FOR REDUCING EFFECTS OF COUPLING BETWEEN STORAGE ELEMENTS OF ADJACENT ROWS OF MEMORY CELLS

(75) Inventors: Raul-Adrian Cernea, Santa Clara, CA (US); Khandker N. Quader, Sunnyvale, CA (US); Yan Li, Milpitas, CA (US); Jian Chen, San Jose, CA (US); Yupin Fong, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 11/055,776

(22) Filed: Feb. 9, 2005

(65) Prior Publication Data

US 2005/0146931 A1   Jul. 7, 2005

Related U.S. Application Data

(63) Continuation of application No. 10/923,320, filed on Aug. 20, 2004, now Pat. No. 6,870,768, which is a continuation of application No. 10/237,426, filed on Sep. 6, 2002, now Pat. No. 6,781,877.

(51) Int. Cl.
*G11C 16/04* (2006.01)

(52) U.S. Cl. .................................. 365/185.03

(58) Field of Classification Search ........... 365/185.03, 365/185.18, 185.28
See application file for complete search history.

(56) References Cited

U.S. PATENT DOCUMENTS

| | | | |
|---|---|---|---|
| 5,095,344 A | 3/1992 | Harari | |
| 5,172,338 A | 12/1992 | Mehrotra et al. | |
| 5,430,859 A | 7/1995 | Norman et al. | |
| 5,532,962 A | 7/1996 | Auclair et al. | |
| 5,570,315 A | 10/1996 | Tanaka et al. | |
| 5,602,987 A | 2/1997 | Harari et al. | |
| 5,657,332 A | 8/1997 | Auclair et al. | |
| 5,663,901 A | 9/1997 | Wallace et al. | |
| 5,712,180 A | 1/1998 | Guterman et al. | |
| 5,768,191 A | 6/1998 | Choi et al. | |

(Continued)

FOREIGN PATENT DOCUMENTS

EP        1271553 A2    1/2003

(Continued)

OTHER PUBLICATIONS

SanDisk Corporation, "Description of SanDisk 64 Megabyte Memory Product Existing Before the Year 2000." Aug. 21, 2002, 2 pages.

(Continued)

*Primary Examiner*—Huan Hoang
(74) *Attorney, Agent, or Firm*—Parsons Hsue & de Runtz LLP (57) ABSTRACT

Techniques of reducing erroneous readings of the apparent charge levels stored in a number of rows of memory cells on account of capacitive coupling between the cells. All pages of a first row are programmed with a first pass, followed by programming all pages of a second adjacent row with a first pass, after which the first row is programmed with a second pass, and then all pages of a third row are programmed with a first pass, followed by returning to program the second row with a second pass, and so on, in a back-and-forth manner across the rows of an array. This minimizes the effect on the apparent charge stored on rows of memory cells that can occur by later writing data into adjacent rows of memory cells.

11 Claims, 4 Drawing Sheets

U.S. PATENT DOCUMENTS

| | | |
|---|---|---|
| 5,774,397 A | 6/1998 | Endoh et al. |
| 5,867,429 A | 2/1999 | Chen et al. |
| 5,890,192 A | 3/1999 | Lee et al. |
| 5,936,884 A * | 8/1999 | Hasbun et al. ......... 365/185.03 |
| 6,046,935 A | 4/2000 | Takeuchi et al. |
| 6,058,042 A * | 5/2000 | Nobukata ............. 365/185.03 |
| 6,091,633 A | 7/2000 | Cernea et al. |
| 6,103,573 A | 8/2000 | Harari et al. |
| 6,151,248 A | 11/2000 | Harari et al. |
| 6,243,290 B1 | 6/2001 | Kurata et al. |
| 6,373,746 B1 | 4/2002 | Takeuchi et al. |
| 6,426,893 B1 | 7/2002 | Conley et al. |
| 6,512,263 B1 | 1/2003 | Yuan et al. |
| 6,522,580 B1 | 2/2003 | Chen et al. |
| 6,781,877 B1 | 8/2004 | Cernea et al. |
| 6,870,768 B1 | 3/2005 | Cernea et al. |
| 2003/0082871 A1 | 5/2003 | Harari et al. |

FOREIGN PATENT DOCUMENTS

| | | |
|---|---|---|
| EP | 1329898 A2 | 7/2003 |

OTHER PUBLICATIONS

"Notification of Transmittal of the International Search or the Declaration", corresponding PCT application No. PCT/US03/25512, International Searching Authority, European Patent Office, Aug. 8, 2003. 6 pages.

Lee, Jae-Duk et al., "Effects of Parasitic Capacitance on NAND Flash Memory Cell Operation", Non-Volatile Semiconductor Memory Workshop, IEEE, Aug. 12-16, 2001, pp. 90-92.

* cited by examiner

TECHNIQUES FOR REDUCING EFFECTS OF COUPLING BETWEEN STORAGE ELEMENTS OF ADJACENT ROWS OF MEMORY CELLS

CROSS-REFERENCE TO RELATED APPLICATION

This application is a continuation of application Ser. No. 10/923,320, filed Aug. 20, 2004, now U.S. Pat. No. 6,870,768, which in turn is a continuation of application Ser. No. 10/237,426, filed Sep. 6, 2002, now U.S. Pat. No. 6,781,877, which applications are incorporated herein in their entirety by this reference.

FIELD OF THE INVENTION

This invention relates generally to the field of data memories, and, more specifically, to memories of the type that store data as levels of electronic charge, including, but not limited to, flash electrically erasable and programmable read-only-memories (flash EEPROMs) utilizing either conductive floating gates or dielectric material as charge storage elements.

BACKGROUND OF THE INVENTION

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states (4 data bits) per storage element, are contemplated. Each storage element memory transistor has a certain total range (window) of threshold voltages in which it may practically be operated, and that range is divided into the number of states defined for it plus margins between the states to allow for them to be clearly differentiated from one another.

As the number of states stored in each memory cell increases, the tolerance of any shifts in the programmed charge level on the storage elements decreases. Since the ranges of charge designated for each storage state must necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with that cell, such as those in the same column or row, and those sharing a line or node.

Apparent shifts in the stored charge levels occur because of field coupling between storage elements. The degree of this coupling is necessarily increasing as the spaces between memory cell storage elements are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. This is known as the Yupin effect, and is described in U.S. Pat. No. 5,867,429, which patent is incorporated herein in their entirety by this reference. This patent describes either physically isolating the two groups of storage elements from each other, or taking into account the effect of the charge on the second group of storage elements when reading that of the first group.

SUMMARY OF THE INVENTION

According to an application of one aspect of the present invention, in order to overcome the effects on each other of adjacent programmed rows of memory cells, adjacent rows are programmed in two steps. In a first step, a first row of memory cells is programmed with data to a first, intermediate set of threshold levels. After a second adjacent row of memory cells is similarly programmed, the threshold levels of the first row of memory cells are increased to a second, final set of threshold levels. Since the final programming of the first row occurs under the influence of the second row's initial programming, data read from the first row is not adversely affected by the levels initially programmed into the second row. After a third row adjacent the second row is programmed to the first set of threshold levels, the threshold levels of the second row are increased to the final set. The process is continued for the programming of any additional rows of memory cells having field coupling between adjacent rows.

According to an application of another aspect of the present invention, an identification of the set of levels at which a group, such as a row, of cells has been programmed is stored in a manner to be read along with the programmed group of cells. A group of memory cells is initially read with applied read voltages chosen for optimally reading cells programmed with the most common one of the sets of levels. If the initially read identification shows that the cells were programmed with the other set of levels, however, the group of cells is re-read with applied read voltages corresponding to the other set of levels.

The present invention can be implemented in various types of flash EEPROM cell arrays. A NOR array of one design has its memory cells connected between adjacent bit (column) lines and control gates connected to word (row) lines. The individual cells contain either one storage element transistor, with or without a select transistor formed in series with it, or two storage element transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, 6,091,633, 6,103,573 6,151,248 6,426,893, 6,512,263, 6,762,092 , and 6,936,887.

A NAND array of one design has a number of memory cells, such as 8, 16 or even 32, connected in a series string between a bit line and a reference potential through select transistors at either end. Word lines are connected with control gates of cells across different series strings. Relevant examples of such arrays and their operation are given in the following U.S. patents and patent application that are incorporated herein in their entirety by this reference: U.S. Pat. Nos. 5,570,315, 5,774,397 and 6,046,935, and 6,522,580. Briefly, two bits of data from different logical pages of incoming data are programmed into one of four states of the individual cells in two steps, first programming a cell into one state according to one bit of data and then, if the data makes it necessary, re-programming that cell into another one of its states according to the second bit of incoming data.

The above-referenced patents and patent applications describe flash EEPROM systems that use conductive floating gates as memory cell storage elements. Alternatively, flash EEPROM systems with memory cells employing charge trapping dielectric material in place of floating gates are operated in substantially the same way. Examples of this are included in patent application Ser. No. 10/002,696, filed Oct. 31, 2001, by Harari et al., entitled "Multi-State Non-Volatile Integrated Circuit Memory Systems that Employ Dielectric Storage Elements," published as US 2003/0082871 A1 May 1, 2003 which application is incorporated herein by this reference. Field coupling between dielectric storage elements of adjacent memory cells can also affect the accuracy of the data read from such memory systems.

Additional aspects, features and advantages of the present invention can be had from the following detailed description of exemplary embodiments thereof, which description should be read along with reference to the accompanying drawings.

DETAILED DESCRIPTION OF EXEMPLARY EMBODIMENTS

Figure 1:
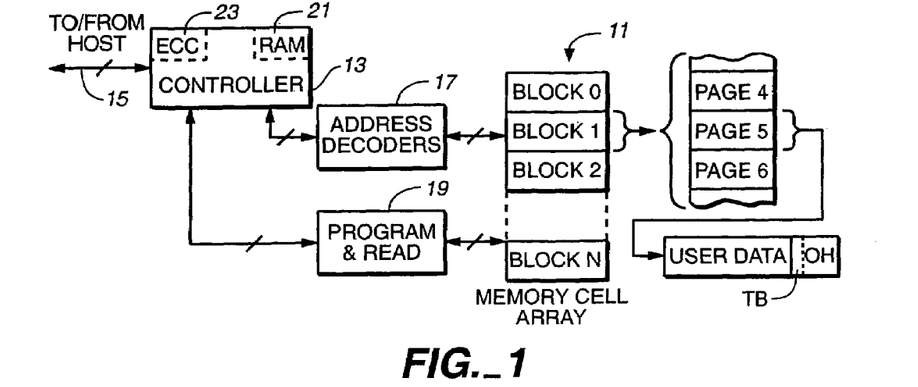
FIG. 1 schematically illustrates an example memory system and operation in which the present invention may be implemented.

In order to explain the present invention and example implementations, a general diagram of the interrelationship of major components of an example mass memory system is shown in FIG. 1. A primary component of this system is a memory 11, such as an array of memory cells formed on a semiconductor substrate, wherein one or more bits of data are stored in the individual memory cells by storing one of two or more levels of charge on individual storage elements of the memory cells. A non-volatile flash EEPROM is a common type of memory for such systems, and is used in this example.

A second primary component of the memory system of FIG. 1 is a controller 13. The controller 13 communicates over a bus 15 to a host computer or other system that is using the memory system to store data. The controller 13 also controls operation of the memory cell array 11 to write data provided by the host, read data requested by the host and perform various housekeeping functions in operating the memory. The controller 13 normally includes a general-purpose microprocessor, with associated non-volatile software memory, various logic circuits, and the like. One or more state machines and other controlling circuits may be included as part of the array for controlling the performance of specific routines, in which case the role of the system controller is reduced.

The memory cell array 11 is addressed by the controller 13 through address decoders 17. The decoders 17 apply the correct voltages to gate and bit lines of the array 11 in order to program data to, read data from, or erase a group of memory cells being addressed by the controller 13. Additional circuits 19 include programming drivers that control voltages applied to elements of the array that depend upon the data being programmed into an addressed group of cells. The circuits 19 also include sense amplifiers and other circuits necessary to read data from an addressed group of memory cells. Various specific forms of the circuits 17 and 19 are described in the patents and patent applications identified in the previous Background section. Data to be programmed into the array, or data recently read from the array, are typically stored in a buffer memory 21 within the controller 13. The controller 13 also usually contains various registers for temporarily storing command and status data, and the like.

The array 11 is divided into a large number of BLOCKS 0–N of memory cells. As is common for flash EEPROM systems, the block is the unit of erase. That is, each block contains the minimum number of memory cells that are erased together. Each block is typically divided into a number of pages, as also illustrated in FIG. 1. A page is a unit of programming but the individual pages may be divided into segments. A segment may contain the fewest number of cells that are written at one time as a basic programming operation, storing as little as one byte of data. One or more pages of data are typically stored in one row of memory cells. One sector of data is usually stored within each page, although multiple sectors may be included. As shown in FIG. 1, a sector includes user data and overhead data. Overhead data typically includes an ECC that has been calculated from the user data of the sector. A portion 23 of the controller 13 calculates the ECC when data is being programmed into the array 11, and also checks it when data is being read from the array 11. Alternatively, the ECCs and/or other overhead data are stored in different pages, or even different blocks, than the user data to which they pertain. The overhead data include one or more TB bits (Tracking Bit(s)) that designate the threshold verify level with which the page of data has been programmed. Uses of the TB field are described hereinafter.

A sector of user data is typically 512 bytes, corresponding to the size of a sector in magnetic disk drives. Overhead data is typically an additional 16–20 bytes. One sector of data is most commonly included in each page but two or more sectors may instead form a page. A large number of pages form a block, anywhere from 8 pages, for example, up to 32, 64 or more pages. The number of blocks is chosen to provide a desired data storage capacity for the memory system. The array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which patent is incorporated herein by this reference.

Figure 2:
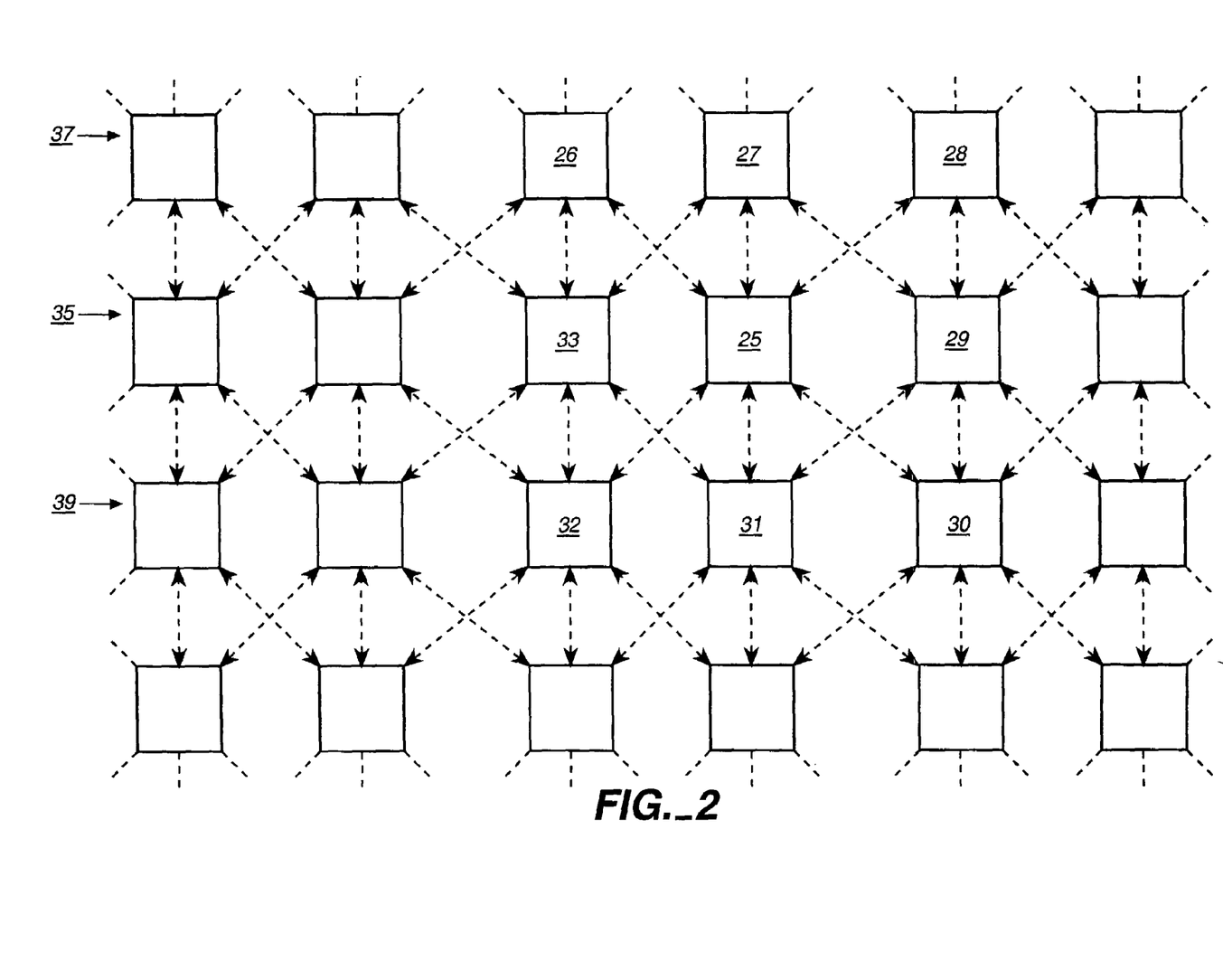
FIG. 2 is an example, in plan view, of storage elements of memory cells within the array of memory cells of the system of FIG. 1.

FIG. 2 shows an arrangement of storage elements (squares) in an array of memory cells in order to illustrate the capacitive coupling (dashed lines) between rows of them. Considering a storage element 25 of a row 35, for example, it is field coupled to storage elements in each of the adjacent rows 37 and 39. The storage element 25 is most closely coupled with the storage elements 27 and 31, because of their proximity, but also have a lesser degree of coupling with storage elements 26, 28, 32 and 30 that are further away. The amount of coupling between two storage elements depends upon the distance between them, the dielectric constant of insulating material between them, whether there are any conductive surfaces between them, and the like.

Although FIG. 2 illustrates only field coupling between rows of storage elements, such coupling also exists between columns of storage elements. This is not being considered in the examples being described herein because, in these examples, data is programmed into memory cells in units of individual rows, the coupling between the rows has been found to be the cause of the apparent shift in programmed levels. For example, if data are programmed as distinct charge levels on the storage elements of the row 35, a later change in the charge levels on either or both of the adjacent rows 37 and 39 will cause a shift in the apparent charge levels that are then read from the storage elements of the row 35. The amount of such a shift in the apparent charge level read from a particular storage element of the row 35 depends upon the degree of coupling with other storage elements whose charge was later changed in level and the amount of that change. When the later change is caused by programming data into the adjacent row, the amounts of the shifts that result are unknown unless the patterns of data programmed into each row are monitored and calculations of their effect made as part of each read operation.

Figure 3:
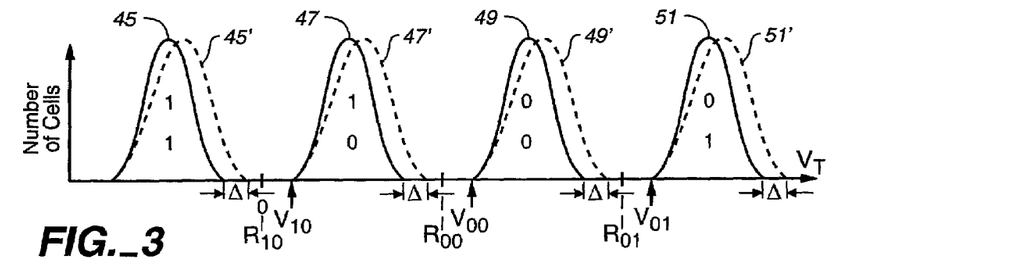
FIG. 3 includes curves of programmed memory cell level distributions that illustrate the effect of field coupling between adjacent groups of memory cells programmed in sequence.

FIG. 3 shows an example of the effect upon a first group of memory cells, such as a row of cells, of the later programming of a second group of memory cells, such as an adjacent row of cells. In this example, four distinct charge levels are defined for each storage element, thereby to store two bits of data on each storage element. Since the level of charge stored on a storage element changes the threshold voltage ($V_T$) of its memory cell transistor, the threshold voltage is shown on the horizontal axis of the curves of FIG. 3. The solid lines show the distributions of the number of threshold voltages of all the cells in a page immediately after being programmed, before any change is made to the adjacent pages. The vertical axis is the number of cells at each threshold level, the curves having essentially a Gaussian distribution. A curve 45 is the distribution of the cells in the erased state, which, in this example, is also designated as a programmed state of the bits 11. When a block of cells is erased, the cells are reset to the 11 state.

Each cell of a page being programmed to one of the other programmed states 47, 49 or 51 has electrons injected onto its storage element until its threshold reaches the state corresponding respectively to the data 01, 00 or 01 being programmed into the cell. Suitable programming techniques are described in other patents identified above in the Background. Briefly, cells of a page being programmed are programmed in parallel. Those being programmed into the 10 state are alternately pulsed with programming voltages and then verified by use of a verify threshold level $V_{10}$. When it is determined that a cell has been programmed to a threshold level above $V_{10}$, programming stops as to that cell but continues for other cells that have not yet reach their verify level. If being programmed to 00, a verify level $V_{00}$ is used. If to 01, a verify level $V_{01}$ is used. The particular data bit pair assigned to each of the distributions 45, 47, 49 and 51 may be different that shown in FIG. 3, and may even be rotated during operation of the memory system in order to even out wear on the array.

It is desired to maintain a sufficient margin between the states 45, 47, 49 and 51 so that the state of each cell can be unambiguously read. When a page of cells programmed as described above are to be read, their states are individually compared to reference threshold levels within the margins between these states. These are shown in the example of FIG. 3 as $R_{10}$ ($V_T=0$), $R_{00}$ and $R_{01}$. Of course, in order to be able to fully use an available threshold window, as many different states are included as is practical, four states being shown. Another example is sixteen states. A larger number of states can result from the width of the distributions being narrowed by programming with smaller voltage increments in successive pulses but this then takes more time to perform the programming. It is therefore desirable, either alone or along with narrowing the programmed cell distributions, to take steps to reduce the need for such large margins between states. Rather large margins are usually maintained in order to allow for the programmed cell distributions to shift or spread as a result of repetitive operating cycles that occur after their programming, as experience has shown to occur. It is highly desirable to reduce such shifting and spreading in order to be able to reduce the amount width of the margins between states.

The spreading of the distributions that occurs as the result of subsequently programming an adjacent row of cells is shown in dashed lines in FIG. 3. Even when significant margins are maintained during the initial programming of a row of cells, these margins can be significantly narrowed when the distributions spread as a result of later programming an adjacent row of cells. If just a few of the cells spread from below to above one of the reading thresholds $R_{10}$, $R_{00}$ and/or $R_{01}$, there can be enough erroneous readings to overwhelm an ECC. In such a case, the data cannot be read with those thresholds, so are normally designated as invalid unless some extraordinary action is taken. One technique used in the past to recover data includes reading the page again by simply moving the reading threshold levels $R_{10}$, $R_{00}$ and/or $R_{01}$ within the margins to avoid the effect of the spreading. Since the spreading can come from both sides of each margin, however, this requires that the margins be maintained wider than is normally desired in order to prevent the distributions of adjacent states from overlapping. It is thus preferable to take some other steps to maintain wide margins between the programmed states.

The programmed distributions appear to spread in the manner shown in FIG. 3 when the data subsequently programmed into the adjacent page is random; that is, when the state stored in each storage element can be any of the four possible states. A storage element programmed to a level at the lower edge of the distribution 47, for example, will be read to have the same level in the distribution 47' if the charge level on adjacent storage elements does not change during the subsequent programming. On the other hand, a storage element initially programmed to a level at the upper edge of the distribution 47 will, if the adjacent storage elements are subsequently programmed from an erased state 11 to the highest state 01, be read to have a level that is increased by an amount Δ. The higher charge levels on the adjacent storage elements are coupled with the previously programmed storage element whose level is being read. Other combinations of initial and later programming of adjacent cells of the distribution 47 fall between these two extremes, thereby resulting in the apparent distribution 47'. The lower end of the apparent distribution 47' remains at the same level but its spread is increased by Δ.

Figure 4A:
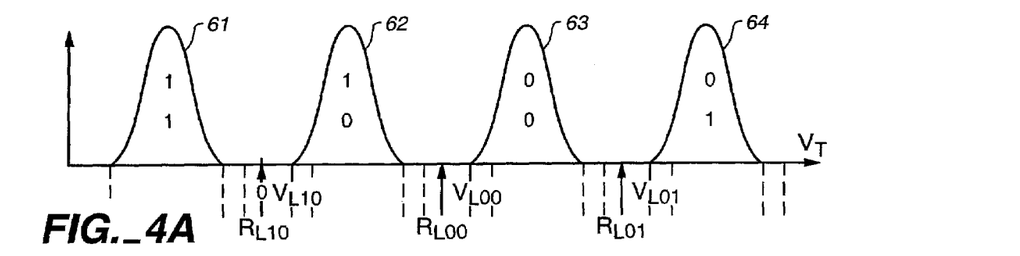
FIGS. 4A–4C are curves that illustrate principles of the present invention and the results of it being practiced according to one example.
Figure 4B:
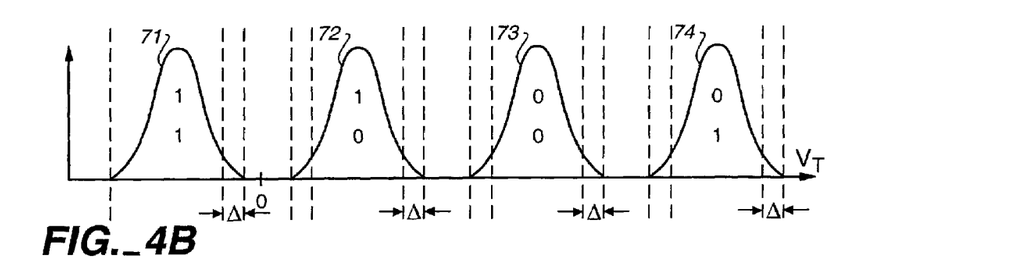
Figure 4C:
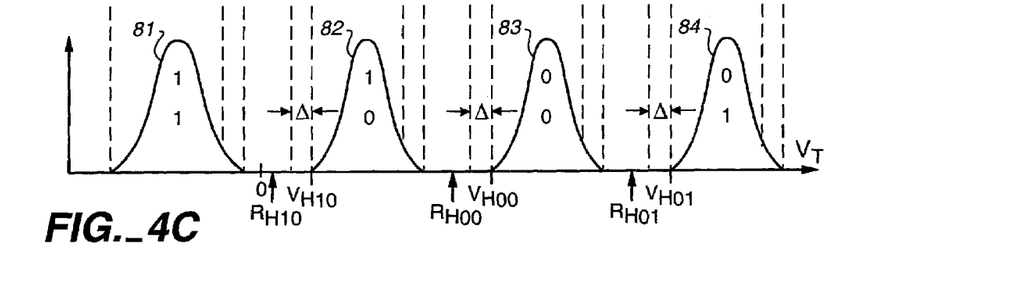

An example of a two pass technique for programming memory cells of the array of FIGS. 2 and 3 is given in FIGS. 4A, 4B and 4C. In FIG. 4A, four state threshold distributions 61, 62, 63 and 64 resulting from a first programming pass of a group, such as a row, are shown. The distribution 61 is for the erased state, which is also the programmed state 11. The curve 62 shows the distribution of the cells programmed to the 10 state by use of a verify threshold level $V_{L10}$ during programming. Similarly, the curve 63 represents the distribution of the cells programmed to the 00 state with a $V_{L00}$ verify level, and the curve 64 the distribution of the cells programmed to the 01 state with a $V_{L01}$ verify level. The programming is accomplished in the typical manner described in the patents and patent applications referenced above, namely by alternately pulsing a chunk of cells being programmed in parallel and then reading (verifying) their states individually, with the programming of each cell being terminated when it is determined to exceed the verify threshold level of the state to which it is being programmed. The distributions 61, 62, 63 and 64 individually have a width that is determined by the magnitude of increase in the level of each program pulse from the last. The distributions 61, 62, 63 and 64 can be the same as the distributions 45, 47, 49 and 51 of FIG. 3 except that the cells represented by FIG. 4A are not yet fully programmed, while those represented by FIG. 3 are fully programmed.

FIG. 4B shows the broadened distributions of FIG. 4A that occur in the programmed cells when another group, such as a row, of physically adjacent cells are subsequently programmed with the same distributions. The distributions 61, 62, 63 and 64 of FIG. 4A spread into respective distributions 71, 72, 73 and 74 upon the programming of the adjacent group of cells whose storage elements are field coupled with those whose thresholds are represented in FIGS. 4A and 4B. The spread is by an amount Δ, as previously described with respect to FIG. 3 for respective distributions 45', 47', 49' and 51'.

After the programming of the adjacent group of cells occurs, which has resulted in the spreading shown in FIG. 4B, the initially programmed group of cells is again programmed with the same data as before but with higher verify levels. The verify levels $V_{L\_}$ used in the initial programming illustrated in FIG. 4A are less than the verify levels $V_{H\_}$ used in the final re-programming of the same group of cells that is illustrated in FIG. 4C. The difference can be, in a specific implementation, the incremental threshold Δ, which is what is shown in FIG. 4C. Since this second, final programming of a group of cells occurs after the programming to the first level ($V_{L\_}$) of the adjacent group of cells, the effect of the adjacent cells through electric field coupling on the first group is automatically taken into account during the second programming step of FIG. 4C. The cells are programmed in the second pass with the field effect of the later programmed adjacent cells existing. The effect on the distributions of the first group of cells of the later second programming step of the adjacent group of cells is very little since the thresholds are increased only a small amount in the second step. It will also be noticed that the distributions of FIG. 4C after the second programming step are narrowed to that of the first programming step of FIG. 4A, assuming that the same programming pulse incremental change is used in both the first and second programming passes of a group of cells.

Although it can be done by other techniques, the increase of the charge level on the cells of the first group during the second programming pass is preferably accomplished by re-programming the cells with the same data but with the higher verify threshold levels being used. This data can remain in a buffer memory after the first programming pass until the second programming pass. But since this requires a larger buffer memory than usual, it is usually not desirable. Preferably, the data programmed into a group of cells with the lower threshold levels $V_{L\_}$ are read from that group after the adjacent group of cells is initially programmed. The read data is then re-programmed into the same cells but with the higher threshold levels $V_{H\_}$.

Exemplary reading threshold levels are also included in FIG. 4A for cells having been programmed by only the first pass, and in FIG. 4C for those having received both programming passes. In both cases, the read thresholds are positioned approximately mid-way in the margins between adjacent distributions. For cells programmed to the first level (FIG. 4A), the read thresholds are $R_{L10}$, $R_{L00}$ and $R_{L01}$ positioned approximately mid-way between the adjacent distributions. After the second pass programming (FIG. 4C), the read thresholds $R_{H10}$, $R_{H00}$ and $R_{H01}$ are used which correspond to those of FIG. 4A but are higher by some threshold amount, in this case Δ, in order to remain approximately mid-way between the repositioned distributions.

The programming and reading techniques being described are beneficially applied to a memory system, such as flash EEPROM, that has its pages arranged in rows. That is, the techniques are used in a memory cell array where the unit of programming includes one or more rows of memory cells. For example, the process can be explained by reference to FIG. 2. The storage elements of row 35 are programmed with the first pass, followed by programming the storage elements of row 37 with the second pass if they were earlier programmed with the first pass. The row 39 is then programmed with the first pass, followed by programming the row 35 with the second pass. The adjacent rows of memory cell storage elements are programmed in this back-and-forth manner across an array until the unit of data being programmed has all been programmed. This is also the subject of FIG. 5, where the progress of programming rows 0–7 is illustrated. The last row to be programmed is left programmed with the first pass, the second pass being deferred until a subsequent programming operation that starts with the next adjacent erased row of memory cells. An exception to this may be when the last programmed row is also the last row in the block. The last row of a block may be programmed with one pass at the higher threshold levels $V_{H\_}$. Because blocks of cells are usually isolated from each other, there will be no other later programmed rows that have sufficient field coupling with the last row to affect the values read from the last row of the block.

Since the optimum read voltages for a row depend upon whether the row has been programmed with only one pass (FIG. 4A) or two passes (FIG. 4C), the programmed status of a row is stored during programming as tracking bits (TB). This bit is preferably stored as part of the overhead data for the programmed page of user data. This tracking bits are shown in FIG. 1 to be stored as part of the page overhead data in the same row as the user data. As part of the first programming pass, TB is set LOW to indicate that the programming has occurred with the lower set of verify thresholds. As part of the second programming pass, TB is rewritten to HIGH. In the four state example being described, TB most conveniently uses two bits: For the first pass, TB=11 (LOW), the erased state of one cell, and after the second pass, TB=10 (HIGH), a higher programmed state of that cell. This allows the TB of a page to be easily updated as part of the second programming pass by additional programming of it.

Reading normally occurs with the higher read voltages (FIG. 4C) since most all rows are programmed with two passes. But as part of this initial read operation, the TB is also read. Its value is determined early in the process of reading the page. If TB=LOW, then the page is re-read with the lower set of read voltages (FIG. 4A). Although this requires two reads of some rows, memory performance is not significantly affected because there will normally be a very small proportion of the rows in a memory array that remain programmed with the lower levels at any one time. Even though a row programmed with the lower verify levels is being read with the higher read levels, there should be no error in reading its tracking bits when the erased state 11 is used to indicate TB=LOW.

Figure 5:
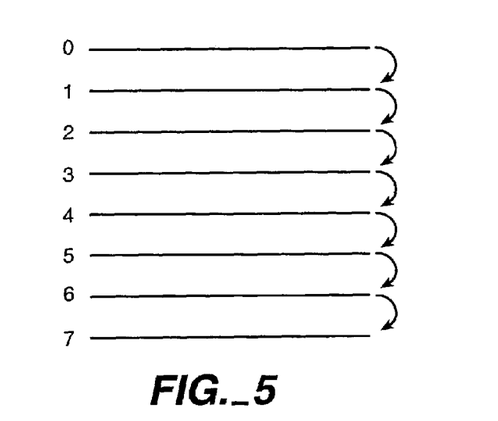
FIG. 5 illustrates an example sequence of programming rows of a particular type of memory array.
Figure 6:
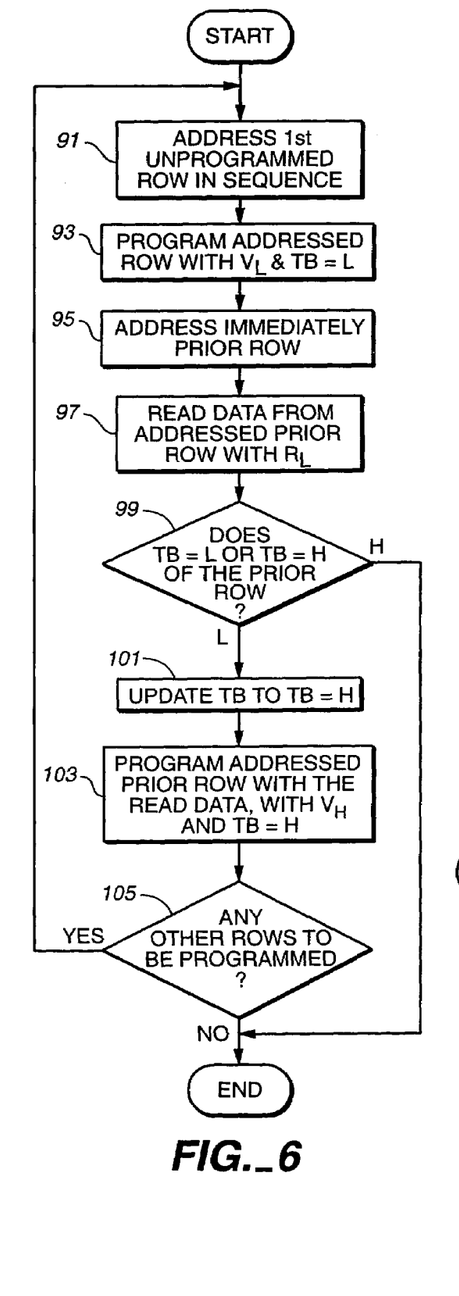
FIG. 6 outlines a series of operations for programming data row-by-row in the sequence of FIG. 5.

The flow chart of FIG. 6 shows the sequence of steps of programming a number of adjacent rows (such as illustrated in FIG. 5) in sequence by using the techniques described above. It will be assumed, for this example, that all pages of rows 0, 1 and 2 are already programmed, rows 0 and 1 with two passes but row 2 with only one pass. A first step in programming subsequent rows 3+ with data is to address row 3, as indicated at 91 of FIG. 6. All pages of row 3 are then programmed by a first pass (FIG. 4A) with TB=LOW, as indicated at 93. The immediately prior row 2 is then addressed, as indicated at 95. Data is then read from the prior row 2 with the low read levels (FIG. 4A), as indicated at 97, including its TB, as indicated at 99. If TB=LOW, which it does in this example, then the read TB is updated to TB=HIGH, at 10. The read data is then re-programmed into the prior row 2, along with its TB=HIGH, as indicated at 103. This completes one cycle of data programming. But since most data programming operations involve programming more pages than are included in one row, it is determined at 105 whether additional rows are to be programmed. If so, the process is repeated by programming the next erased row 4 with a first pass, followed by increasing the charge levels of row 5 by re-programming its data. This cycle continues along the rows of FIG. 5, where the memory cell storage elements of adjacent rows are capacitively coupled with each other to a significant level.

Figure 7:
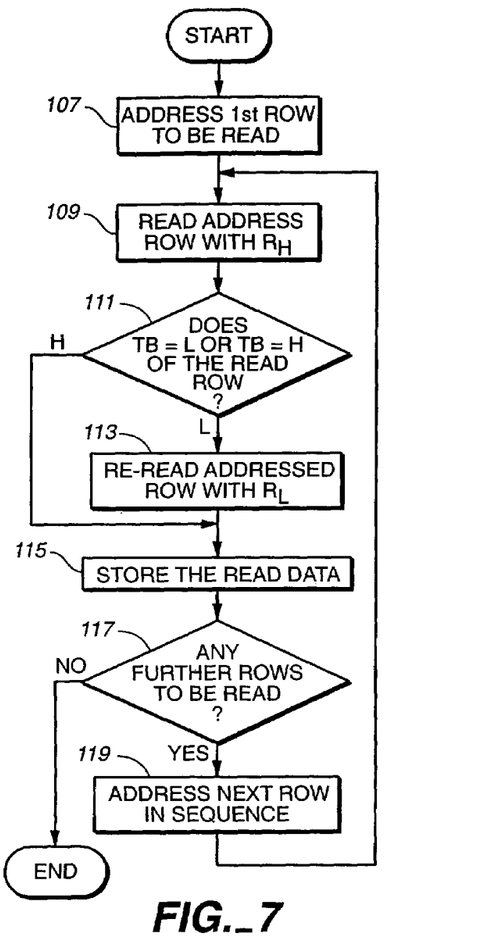
FIG. 7 outlines a series of operations for reading data from rows of a memory that have been programmed according to the method of FIG. 6.

A process of reading data from rows programmed in the manner of FIG. 6 is illustrated in FIG. 7. A first row to be read is addressed, as indicated at 107. That row is then read with the higher read voltages (FIG. 4C), as indicated at 109. Since this read also includes reading the tracking bit, it is determined, at 111, whether TB=LOW or TB=HIGH. If TB=LOW, the row is re-read with the lower read levels (FIG. 4A), as indicated at 113, followed by temporarily storing the read data, at 115. This completes the read for one row. But since most reading operations are of many rows in sequence, an inquiry 117 determines whether more rows are to be read. If so, the next row in order is read, as indicated at 119, and the process returns to 109.

Figure 8:
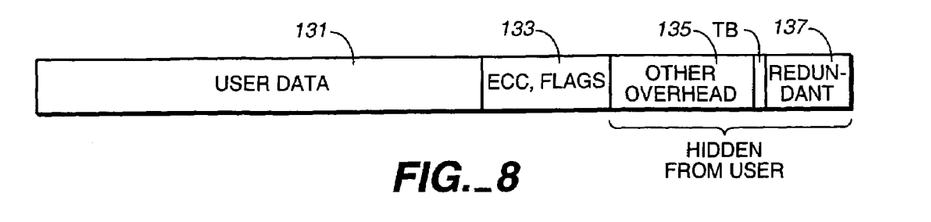
FIG. 8 illustrates a detailed example of the data structure of a page.

With reference to FIG. 8, one example of the data structure of a page of memory cells is described. User data 131 and overhead data 133 that pertain to the user data are stored in a manner to be accessible to the user through the memory controller from the host device. The overhead data 133 includes an ECC calculated from the user data, various flags and the like. Other overhead data 135, such as a count of the number of times the block in which the page of FIG. 8 has been erased and reprogrammed, voltages to be used for programming, reading and erasing, and the like, are hidden from access by the host but are used by the memory controller to operate the memory system. Also stored in the hidden region are the TB bits and, typically, redundant cells 137 are included for substitution for any bits that fail in the user data region 131. Thus, the user cannot access the TB bits from a host device; rather, the TB bits are written and read by the memory system controller.

Although the present invention has been described with respect to exemplary embodiments, it will be understood that the invention is entitled to protection within the full scope of the appended claims.

It is claimed:

1. A method of operating a non-volatile memory having memory cells that store data as different levels of charge in charge storage elements thereof, wherein the memory cells are connected in series strings that individually include eight or more memory cells and have word lines extending across the memory cells of different strings to define rows of memory cells, comprising:
   programming the charge storage elements of a first one of the rows with a first set of data to levels that are less than full charge levels for such data but which still represent the first set of data,
   thereafter programming the charge storage elements of a second one of the rows with a second set of data to levels that are less than full charge levels for such data but which still represent the second set of data, wherein the charge storage elements of the first and second rows are field coupled with each other, and
   thereafter increasing the charge levels on the charge storage elements of the first row to the full storage levels representing the first set of data.

2. The method of claim 1, wherein increasing the charge levels on the charge storage elements of the first row includes:
   reading the data represented by the less than full charge levels stored in the memory cells of the first row, and
   thereafter programming the memory cells of the first row with the data read therefrom to increase the charge levels on the charge storage elements of the first row to the full storage levels represented by the first set of data.

3. The method of claim 2, wherein increasing the charge levels on the charge storage elements of the first row is accomplished without erasing the charge levels stored in the memory cells of the first row.

4. The method of claim 1, wherein the charge storage elements are electrically conductive floating gates.

5. The method of claim 1, wherein the different levels of charge that store data in the charge storage elements include more than two defined levels, thereby to store more than one bit of data in individual charge storage elements.

6. The method of claim 1, wherein programming the charge storage elements of the first row with a first set of data includes storing an indication that the data are stored with charge levels that are less than full charge levels for such data, and wherein increasing the charge levels on the charge storage elements of the first row includes storing an indication that the data are stored with charge levels that are the full storage levels representing the first set of data.

7. The method of claim 6, additionally comprising reading data from the charge storage elements of the first row in a manner dependent upon the stored indication.

8. A method of operating a non-volatile memory having memory cells that store data as different levels of charge in charge storage elements thereof and which are arranged in defined groups of memory cells, comprising:

programming the charge storage elements of a first one of the groups of memory cells with a first set of data to levels that are less than full charge levels for such data but which still represent the first set of data, including storing an indication that the data have been programmed with less than the full charge levels, thereafter programming the charge storage elements of a second one of the groups with a second set of data to levels that are less than full charge levels for such data but which still represent the second set of data, including storing an indication that the data have been programmed with less than the full charge levels, wherein the charge storage elements of the first and second groups are field coupled with each other, and thereafter increasing the charge levels on the charge storage elements of the first group to the full storage levels representing the first set of data, including:

reading the data represented by the less than full charge levels stored in the memory cells of the first group, thereafter programming the memory cells of the first group with the data read therefrom to increase the charge levels on the charge storage elements of the first group to the full storage levels represented by the first set of data, and storing an indication that the data have been programmed in the first group with the full charge levels.

9. The method of claim 8, wherein increasing the charge levels on the charge storage elements of the first group is accomplished without erasing the less than full charge levels stored in the charge storage elements of the first group.

10. The method of claim 8, wherein the charge storage elements are electrically conductive floating gates.

11. The method of claim 8, wherein the different levels of charge that store data in the charge storage elements include more than two defined levels, thereby to store more than one bit of data in individual charge storage elements.

* * * * *